United States Patent [19]
Tang et al.

[11] Patent Number: 6,023,570
[45] Date of Patent: Feb. 8, 2000

[54] SEQUENTIAL AND SIMULTANEOUS MANUFACTURING PROGRAMMING OF MULTIPLE IN-SYSTEM PROGRAMMABLE SYSTEMS THROUGH A DATA NETWORK

[75] Inventors: Howard Y. M. Tang, San Jose; Cyrus Y. Tsui, Los Altos; Albert Chan, Palo Alto, all of Calif.

[73] Assignee: Lattice Semiconductor Corp., Hillsboro, Oreg.

[21] Appl. No.: 09/023,506

[22] Filed: Feb. 13, 1998

[51] Int. Cl.$^7$ ..................................................... G06F 13/38
[52] U.S. Cl. ........................... 395/500.18; 326/38; 326/39
[58] Field of Search ............................... 395/500, 500.18, 395/500.02; 326/38, 37

[56] References Cited

U.S. PATENT DOCUMENTS

| | | | |
|---|---|---|---|
| 4,849,928 | 7/1989 | Hauck | 364/900 |
| 5,237,218 | 8/1993 | Josephson et al. | 307/465 |
| 5,309,351 | 5/1994 | McCain et al. | 364/132 |
| 5,457,408 | 10/1995 | Leung | 326/38 |
| 5,543,730 | 8/1996 | Cliff et al. | 326/38 |
| 5,581,779 | 12/1996 | Hall et al. | 395/800.43 |
| 5,635,855 | 6/1997 | Tang | 326/38 |
| 5,734,868 | 3/1998 | Curd et al. | 395/500 |
| 5,751,163 | 5/1998 | Tang et al. | 326/38 |
| 5,833,469 | 11/1998 | Ito et al. | 434/307 A |

FOREIGN PATENT DOCUMENTS

| | | | |
|---|---|---|---|
| 0 806 737 | 11/1997 | European Pat. Off. | G06F 17/50 |
| 94 08399 | 4/1994 | WIPO | H03K 19/177 |

OTHER PUBLICATIONS

Brown et al, "Remote Service Methods for Cellular Communication Systems," 1995 IEEE 45th Vehicular Technology Conference, pp. 170–174.

S. Nisbet et al.: "The XC6200DS Development System" Field–Programmable Logic and Applications. 7th International Workshop, FPL '97. Proceedings, London, UK, Sep. 1–3, 1997, pp. 61–68, XP000783988 ISBN 3–540–63465–7, 1997, Berlin, Germany, Springer–Verlag, Germany.

M. A. Moran: Customers' Needs Drive Complex PLDs to In–System Programmability. WESCON/'95 Conference, 'Microelectronics Communications Technology Producing Quality Products Mobile and Portable Power Emerging Technologies.' Nov. 1995, pp. 213–217.

*Primary Examiner*—Kevin J. Teska
*Assistant Examiner*—Samuel Broda
*Attorney, Agent, or Firm*—Skjerven, Morrill, MacPherson, Franklin & Friel LLP

[57] ABSTRACT

An in-system programmable (ISP) system, having a plurality of ISP devices, can be programmed by remote access from a host controller. The remote access can be accomplished over a wired data network, a wireless data network such as an infra-red data network and a radio wave data network, or a hybrid network including both a wired data network portion and a wireless data network portion. An access interface connects the host controller to an ISP programmer over the wired or wireless communication link. The ISP programmer programs the ISP system in accordance with ISP programming conventions. The ISP programmer can be provided by an integrated circuit having a microprocessor core.

69 Claims, 9 Drawing Sheets

SEQUENTIAL AND SIMULTANEOUS MANUFACTURING PROGRAMMING OF MULTIPLE IN-SYSTEM PROGRAMMABLE SYSTEMS THROUGH A DATA NETWORK

BACKGROUND OF THE INVENTION

1. Field of the Invention

This invention relates to programmable integrated circuits. More specifically, the present invention relates to techniques for programming, sequentially or simultaneously, multiple printed circuit boards which include programmable integrated circuits.

2. Description of the Related Art

Programmable devices that can be programmed and reprogrammed without being removed from their application environment are very valuable in many applications. One type of such device is the "In-System Programmable Logical Device" or "ISP PLD," available from Lattice Semiconductor Corporation. The term "manufacturing programming" refers to the programming of blank "ISP PLD" devices which are already mounted on the printed circuit boards. Such programming is typically achieved by transferring into the "ISP PLD" a bit pattern, which is typically provided to the programmer in an industry standard data format called the JEDEC file format. A method for converting a file in the JEDEC file format to an ispSTREAM file format, which is a file format widely adopted for use with "ISP PLD" devices, is disclosed in U.S. Pat. No. 5,635,855, entitled "Method for Simultaneous Programming of In-System Programmable Integrated Circuits," to Tang et al., filed on Jul. 21, 1995 and issued on Jun. 3, 1997.

A reprogrammable system is reprogrammed by a host programming device over a hard-wired connection. It is desirable to allow such a programmable system to be reprogrammed over wired or wireless links established at the time of reprogramming, so as to allow reprogramming by a remote programmer (e.g., a portable programming device or a programming device), regardless of where the programmer is located.

SUMMARY OF THE INVENTION

The present invention provides a system for programming multiple programmable integrated circuits. In one embodiment, such a system includes: a) an in-system programmable (ISP) system having multiple ISP devices (e.g., in-system programmable logical devices or "ISP PLDs," available from Lattice Semiconductor Corporation); b) a programmmer communicating with the ISP system for programming the ISP devices; c) a controller (e.g., a PC or a Workstation) which transmits control data and programming data (e.g., an ispSTREAM file) to the programmer; and d) an access interface (e.g., a serial or parallel port interface) in the programmer which connects the controller to the programmer over a communication link (e.g., a communication link in a hardwire data network, an infra-red data network, or a radio wave data network).

In accordance with one aspect of the present invention, at the beginning of the programming, programming data is transferred to a controller, such as a PC or a Workstation, which stores the data in a mass storage device, such as a hard disk. The controller then establishes communication with a Multiple Systems Parallel Programmer (Parallel Programmer) over a communication link. The communication link connects the controller to the access interface of the Parallel Programmer. The communication link can be a wired or a wireless data network, such as a radio wave or an infra-red signal.

In accordance with another aspect of the present invention, the Parallel Programmer includes a central processing unit (CPU) and the access interface implemented by either a serial or a parallel port interface. The Parallel Programmer can additionally include a writeable control store, e.g., one that is implemented by an erasable programmable read-only memory ("EPROM"), accessible by the central processing unit. The writeable control store includes the operation program of the Parallel Programmer. Programming data received from the controller through the access interface are typically stored in a random access memory ("RAM") of the Parallel Programmer. From the RAM, programming data is typically provided to a clocked memory element (e.g., a set of latches) to drive ISP programming signals. Multiple ISP systems can be programmed in a parallel.

Each ISP device is programmed under the control of a programming clock signal and a mode signal. The ISP devices receive control and programming data from a serial input signal and provide data output, including status, control and programming data, through a serial output signal.

Alternatively, multiple ISP System Programmers ("Programmers") can be used in place of a single Parallel Programmer. Typically, each Programmer is equipped similar to a Parallel Programmer except that, in this embodiment, a different Programmer is connected to each ISP system, so as to allow the Programmers to program their respective ISP systems simultaneously. In contrast, a Parallel Programmer programs its ISP systems sequentially.

DETAILED DESCRIPTION OF THE PREFERRED EMBODIMENTS

Figure 1:
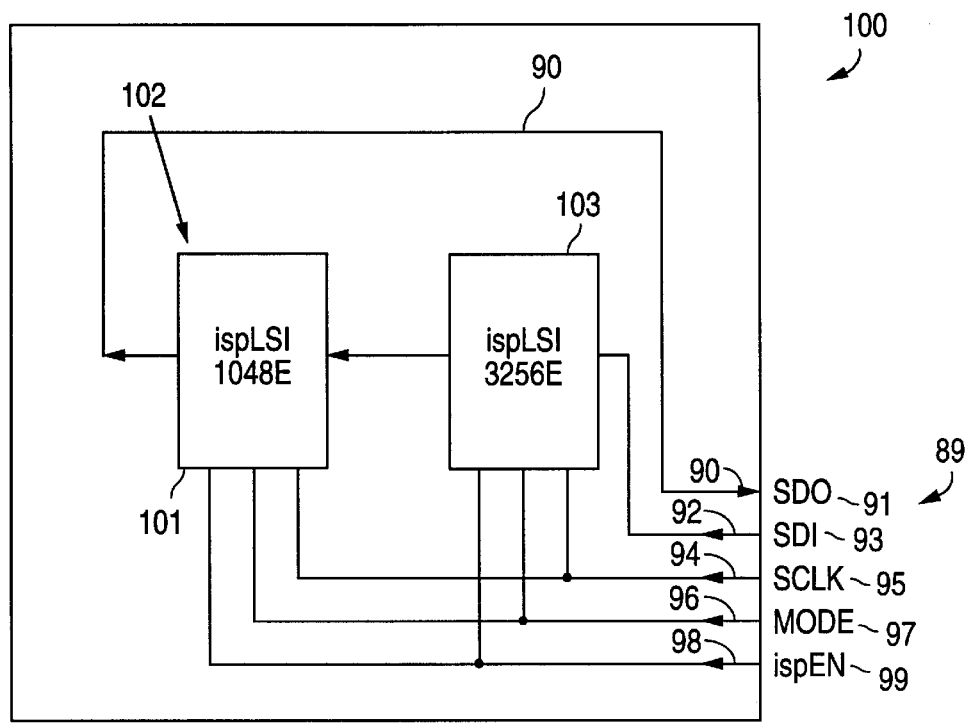
FIG. 1 illustrates an in-system programmable (ISP) system 100; ISP system 100 includes ISP devices 102 represented by ispLSI devices 101 and 103.

The present invention is specifically illustrated in this detailed description using configurations for remotely accessing and programming an in-system programmable (ISP) system over a wired or wireless data network. In this description, to simplify discussion, like elements in the drawings are provided like reference numerals.

FIG. 1 illustrates an ISP system 100 including ISP devices 102 ("ISP PLDs"), represented by ispLSIs 101 and 103. ISP devices 102 are programmed using four (4) ISP input signals 89. Input signals 89 consist of a serial data input signal 93 (SDI), a clock signal 95 (SCLK), a control signal 97 (MODE), and an ISP mode enable signal 99 (ispEN). The programmed data can be read out through serial data output signal 91 (SDO) using a "verify" command implemented in an ISP state machine of the ISP PLD. Signals 95, 97, and 99, provided respectively on terminals 94, 96, and 98, are applied in parallel to each of ispLSIs 101 and 103 to control their programming. In addition, as shown in FIG. 1, signal 93 (i.e., serial data input signal SDI) is transmitted via terminal 92 through a daisy chain of the SDI and SDO terminals of ispLSI 101 and 103. The functions of input signals 89 are: (a) SCLK signal 95 synchronizes shifting of programming data 109; (b) MODE signal 97 indicates whether control data or programming data 109 is shifting into or out of ISP devices 102; and (c) ispEN signal 99 causes a state machine within each of ispLSIs 101 and 103 to go into a programming mode.

Figure 2:
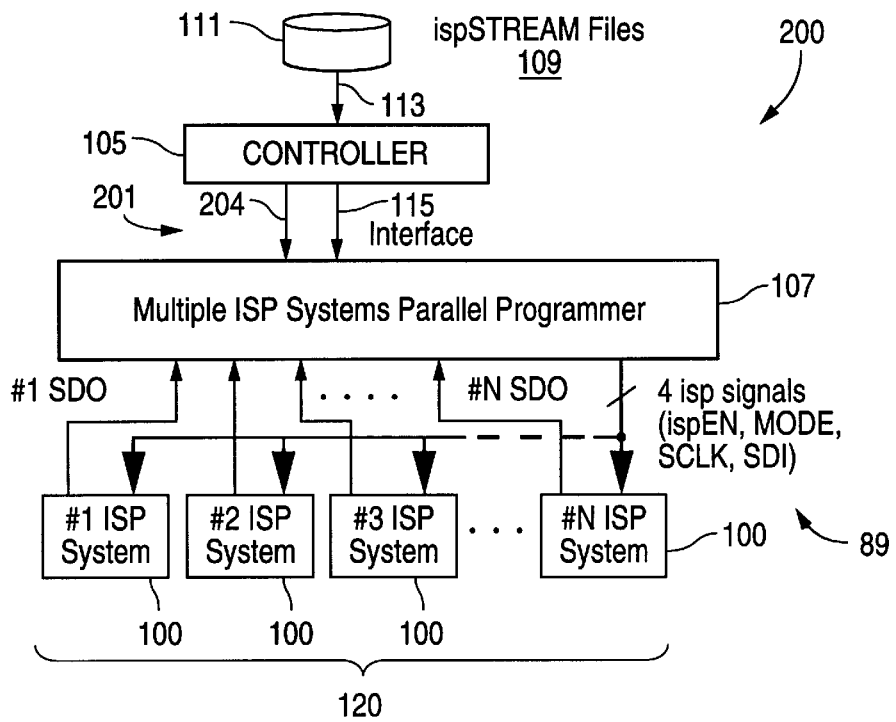
FIG. 2 illustrates a first configuration 200 of a first embodiment of the present invention, utilizing a Multiple ISP Systems Parallel Programmer (Parallel Programmer) 107, which is remotely accessible by a controller 105 over a wired data network 201.

Manufacturing programming of multiple ISP systems under the present invention is illustrated in the configurations shown in FIGS. 2–4 and 6–8B. Referring to FIG. 2, programming of the numerous ISP systems 120 of configuration 200, each labeled 100, is initiated when programming data 109 are transferred from a storage element 111 to a controller 105 by a floppy disk or via a communication link, as indicated by arrow 113 (see also FIGS. 3, 4 and 6–8B). Programming data 109, for example, can be provided by an ispSTREAM file, which is a file format widely adopted for use with ISP PLDs and its definition is available from Lattice Semiconductor Corporation. In an ispSTREAM file, programming commands and programming data 109 for the ISP PLDs are compiled in a binary format. Controller 105, which can be implemented by a personal computer (PC) or a workstation, stores programming data 109 in a mass storage device, such as a hard disk. As shown in FIG. 2, controller 105 is coupled to a Multiple ISP Systems Parallel Programmer (Parallel Programmer) 107 through a communication link 201. Communication link 201 represents a wired data network coupling controller 105 coupled to a standard parallel port 204 or a serial port 115 of the PC or the workstation.

Figure 3:
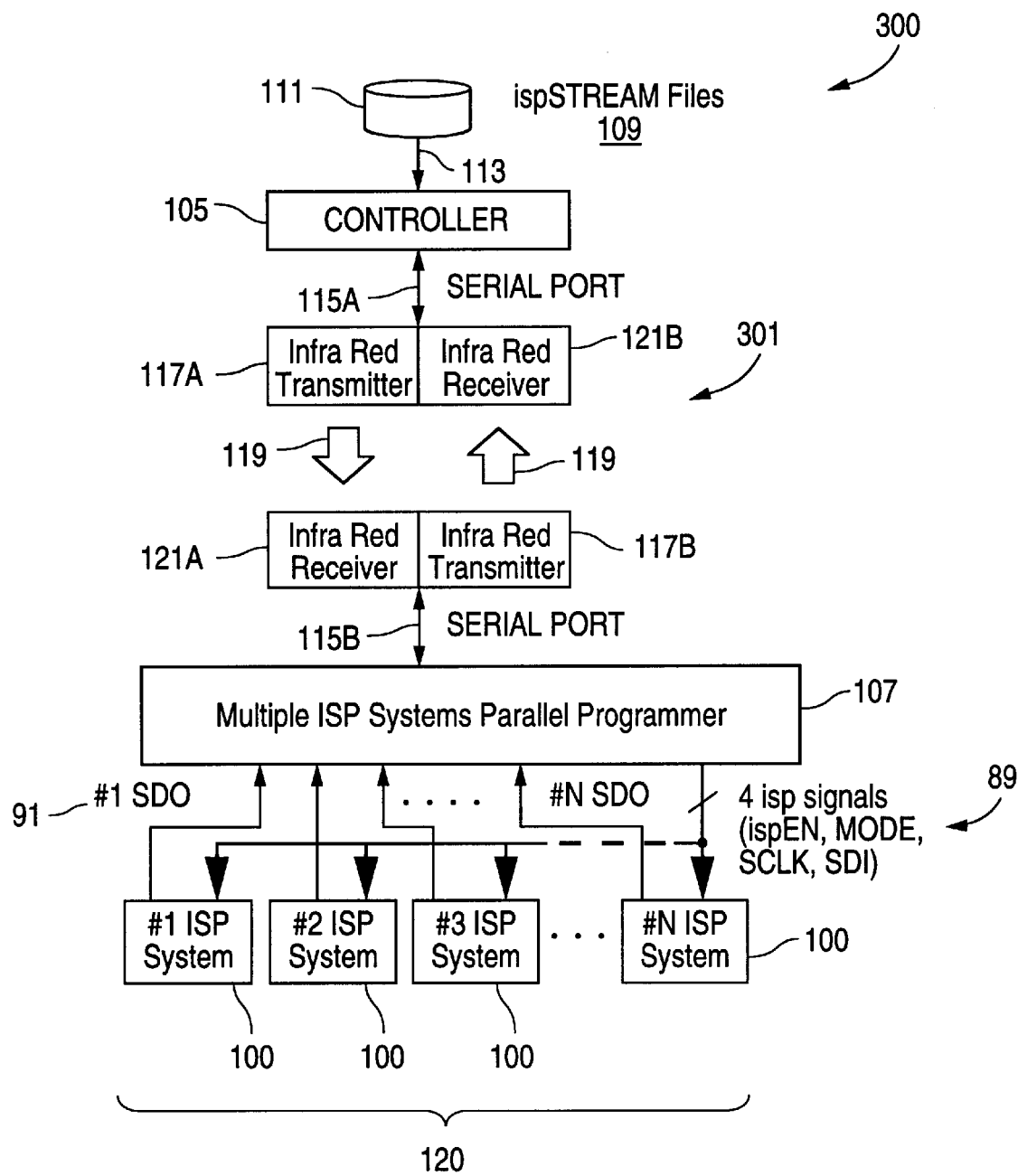
FIG. 3 illustrates a second configuration 300 of the first embodiment of the present invention, utilizing Parallel Programmer 107, which is remotely accessible by controller 105 over a wireless infra-red data network 301.
Figure 4:
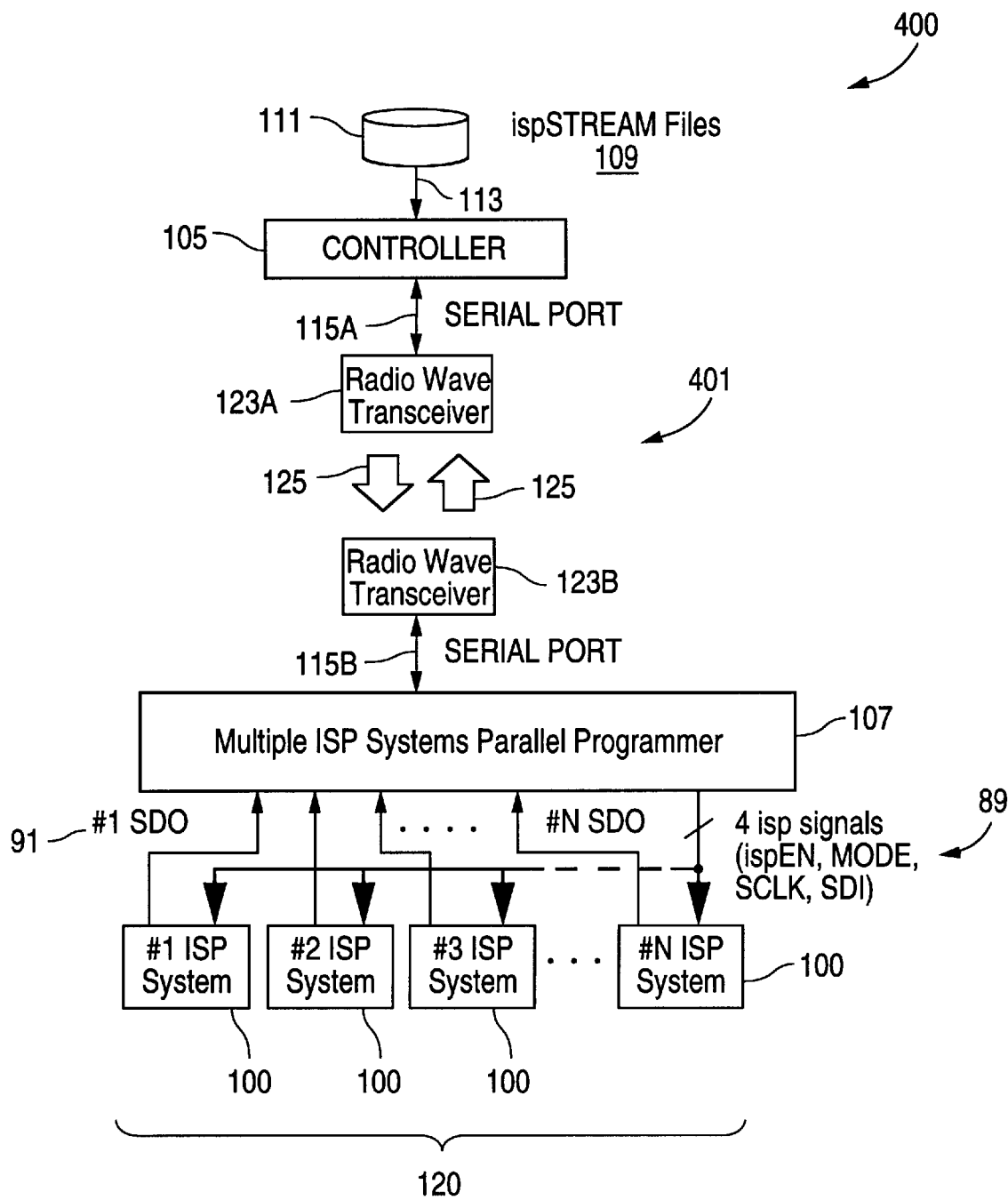
FIG. 4 illustrates a third configuration 400 of the first embodiment of the present invention, utilizing Parallel Programmer 107, which is remotely accessible by controller 105 over a wireless radio wave data network 401.
Figure 6:
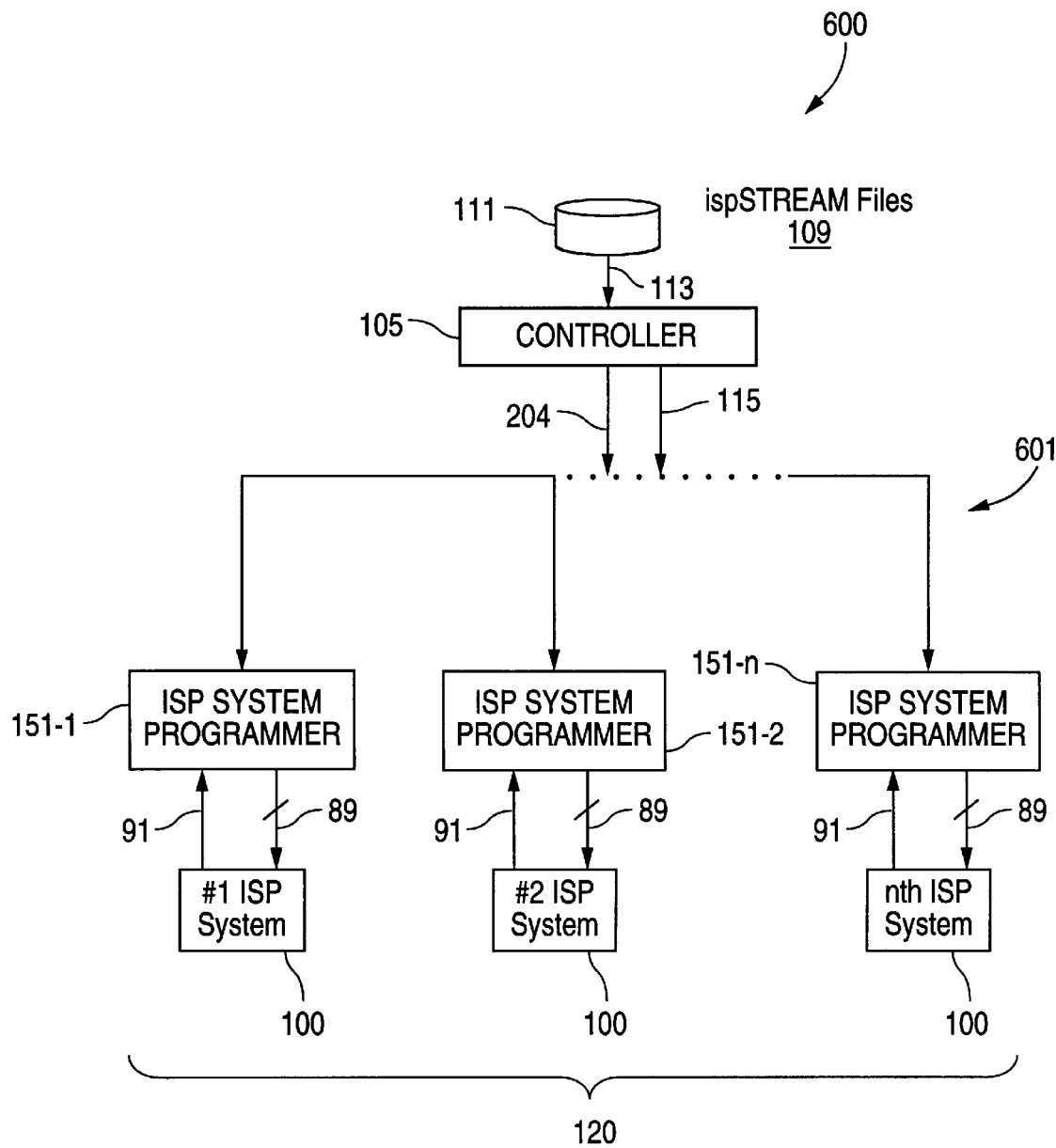
FIG. 6 illustrates a first configuration 600 of a second embodiment of the present invention, utilizing multiple ISP System Programmers 151, which are remotely accessed by controller 105 over a wired data network 601.

In alternative configurations illustrated by configurations 300 and 400 of FIGS. 3 and 4, communication between controller 105 and an access interface (e.g., serial port interface 115B) of Parallel Programmer 107 can be provided by an infra-red communication link 301 (FIG. 3), or a radio wave communication link 401 (FIG. 4). Referring to FIG. 3, controller 105 sends commands or programming data 109 in 8-bit bytes to a serial port interface 115A. The commands and programming data are transmitted by an infra-red transmitter 117A as sequence pulses 119. A receiver 121A at the access interface (i.e., serial port interface 115B) of Parallel Programmer 107 receives pulses 119 and reconstitutes pulses 119 as commands and programming data to Parallel Programmer 107. As communication link 301 is bi-directional, data is transferred from Parallel Programmer 107 to controller 105 by infra-red communication link 301 in substantially the same manner as described above but in the reverse direction through transmitter 117B and receiver 121B. Infra-red wireless communication link 301 allows Parallel Programmer 107 to be physically and electrically isolated from controller 105, thus providing flexibility in implementation. Electrical isolation reduces electrical noises coupled into Parallel Programmer 107 from controller 105, resulting in a more reliable and higher quality ISP programming.

Similarly, referring to configuration 400 of FIG. 4, wireless radio wave communication link 401 is provided in place of infra-red communication link 301 of FIG. 3. In configuration 400, data is sent between controller 105 and Parallel Programmer 107 by transceivers 123A and 123B at the serial ports 115A and 115B respectively. Thus, as in configuration 300, configuration 400 provides a ISP programming system in which controller 105 is electrically isolated from Parallel Programmer 107, thus ensuring highly reliable ISP programming operations.

Those skilled in the art would appreciate from configurations 200, 300 and 400 that many variations and modifications of communication links 201, 301 and 401 can be practiced within the scope of the present invention. For example, communication links between controller 105 and Parallel Programmer 107 can be implemented in a network including both wired and wireless components interconnected by "gateways."

Figure 5:
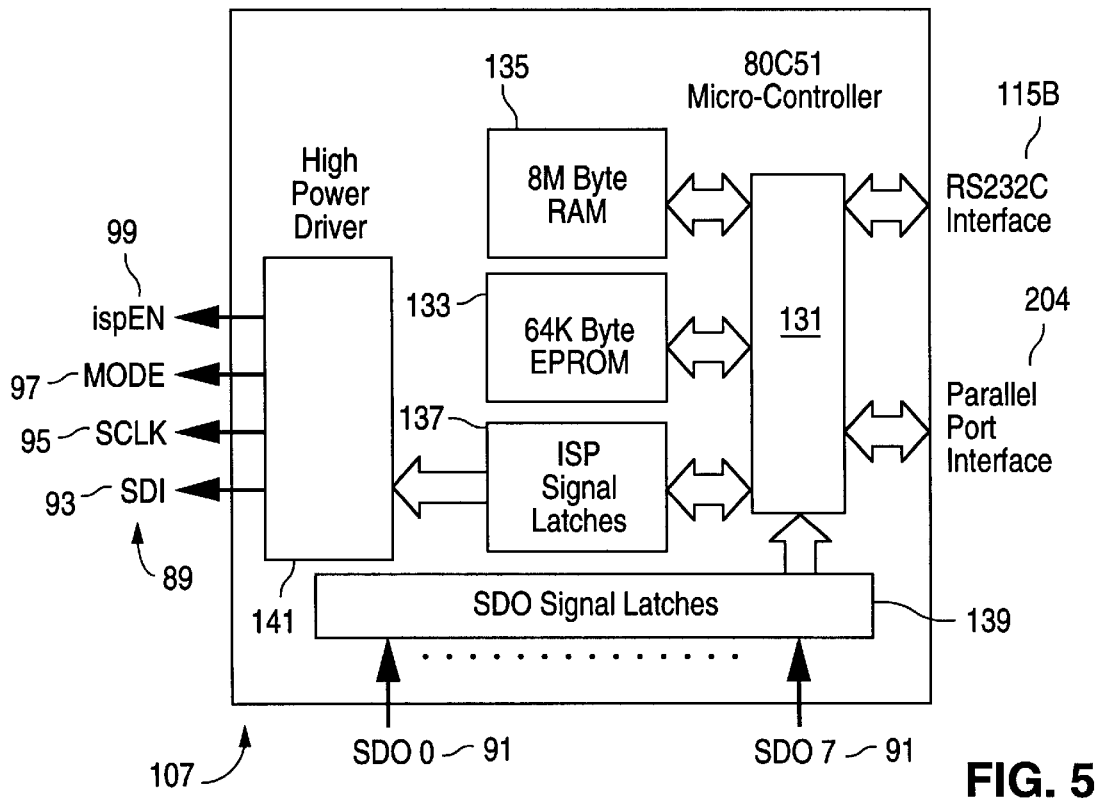
FIG. 5 illustrates components of Parallel Programmer 107, suitable for programming and reprogramming ISP systems 100 of FIGS. 1–4.

Controller 105 runs a program which controls the operations of the Parallel Programmer 107. An implementation of Parallel Programmer 107 is illustrated in FIG. 5. As shown in FIG. 5, Parallel Programmer 107 includes a central processing unit (CPU) 131 (e.g., a 80C51 micro-controller) which executes from a writeable control store implemented by a non-volatile storage element 133 (e.g., a 64K Byte EPROM). Programming data 109, when received from controller 105 via serial port 115B (e.g., RS232C Interface) or parallel port 204 interface, are stored in a random access memory 135 (e.g. 8M Byte RAM). During programming, programming data 109 are read from RAM 135 and provided to a clocked memory element 137 (e.g., a group of signal latches) at a much higher clock rate than the baud rate of serial ports 115B or parallel port 204 to ensure high speed programming operations. Clocked memory element 137 holds values of input signals 89 and provides them to high power drivers 141. This ensures that input signals 89 are provided to each of ISP systems 120 such that the setup time and the hold time requirements on SDI signal 93 and MODE signal 97 relative to SCLK signal 95 are met. A clocked memory element 139 (e.g., a group of latches) receives and holds output data from the SDO signal 91 from ISP systems 120. The operations of Parallel Programmer 107 is discussed in further detail below.

The operation of the controller 105 is summarized in steps 1.1 to 1.10 as follows:

Step 1.1: Controller 105 establishes communication with Parallel Programmer 107. In configuration 200 (FIG. 2), wired communication link 201 couples parallel port 204 or serial port 115 of controller 105 (e.g., a PC or a workstation) to Parallel Programmer 107. In wireless configurations 300 and 400 (FIGS. 3 and 4), infra-red and radio wave communication links 301 and 401 couple serial port 115A to Parallel Programmer 107.

Step 1.2: CPU 131 of Parallel Programmer 107 acknowledges to controller 105 the communication link established at its access interface. CPU 131 executes from control store 133 an operational program which readies Parallel Programmer 107 for receiving transmission of programming data 109.

Step 1.3: Controller 105 sends commands to Parallel Programmer 107 and monitors the response from Parallel Programmer 107. The following commands are sent by controller 105:

i) Connect: This command initiates a connection between Parallel Programmer 107 and controller 105;

ii) Load programming data: This command transfers specified programming data 109 to Parallel Programmer 107;

iii) Program and Verify: This command starts programming operations in Parallel Programmer 107, including verifying programming echoed from ISP systems 120, thus verifying correct programming of ISP systems 120;

iv) Verify: This command initiates in Parallel Programmer 107 "verify" operations in every one of ISP systems 120; and v) Hardware Check: This command initiates a self-check in Parallel Programmer 107.

Step 1.4: Controller 105 retrieves programming data 109 from mass storage device 111 (e.g., disk storage).

Step 1.5: Controller 105 sends the Load programming data command and transmits programming data 109 to Parallel Programmer 107.

Step 1.6: CPU 131 of Parallel Programmer 107 stores programming data 109 into RAM 135. CPU 131 then sends an acknowledgment signal to controller 105 to indicate readiness for the next command.

Step 1.7: Controller 105 sends the Program and Verify command to start the programming and verification process.

Step 1.8: CPU 131 executes a control program which sends ISP program and verify commands to each of ISP systems 120.

Step 1.9: Controller 105 sends the Verify command and CPU 131 returns to controller 105 the result of the VERIFY operation in each of ISP systems 120.

Step 1.10: Controller 105 reports (e.g., by displaying on a monitor) successful or unsuccessful completion of programming for each of ISP systems 120.

The operation of Parallel Programmer 107 is summarized by steps 2.1–2.16 as follows:

Step 2.1: Parallel Programmer 107 waits in a standby mode until commands arrive from controller 105.

Step 2.2: When Parallel Programmer 107 receives a Load programming data command from controller 105, Parallel Programmer 107 reads programming data 109, byte by byte, from serial port 115B or parallel port 204 and stores programming data 109 received into the RAM 135.

Step 2.3: Having received programming data 109, Parallel Programmer 107 signals controller 105 that step 2.2 is completed.

Step 2.4: Parallel Programmer 107 then calculates a checksum for programming data 109 and compares the checksum thus calculated with the checksum appended to the end of programming data 109 to verify that the transmission was successful and that no data corruption has occurred in the transmission process.

Step 2.5: Parallel Programmer 107 reports the result of the transmission to controller 105.

Step 2.6: Parallel Programmer 107 waits for the next command from controller 105.

Step 2.7: Parallel Programmer 107 receives the Program and Verify command, and transfers programming data 109, byte by byte, from the RAM 135 into clocked memory element 137.

Step 2.8: Clocked memory element 137 drives ispEN signal 99 low, thereby setting all of ISP systems 120 into programming mode in parallel.

Step 2.9: Clocked memory element 137 drives SDI signal 93 and SCLK signal 95 to shift ISP instructions and programming data 109 into ISP devices 102 of ISP systems 120 in parallel.

Step 2.10: Clocked memory element 137 drives MODE signal 97 and SCLK signal 95 to step ISP devices 102 in ISP systems 120 to complete the ISP programming cycles in parallel.

Step 2.11: Clocked memory element 137 drives SCLK signal 95 to shift data out from terminal 90 (SDO signal 91) in each of ISP systems 120 in parallel.

Step 2.12: Clocked memory element 139 latches in parallel SDO signals 91 from all ISP systems 120.

Step 2.13: The data in clocked memory element 139 are read by CPU 131 and verified. Any failure in any of ISP systems 120 is recorded by Parallel Programmer 107.

Step 2.14: Steps 2.7–2.13 are repeated until all of ISP systems 120 are programmed.

Step 2.15: Parallel Programmer 107 reports any failure recorded for each of ISP systems 120 to controller 105.

Step 2.16: Parallel Programmer 107 returns to step 2.1.

The following is an exemplary sequence of events representative of the programming of an ISP device (e.g. any of ISP devices 102) using ISP signals 89:

Step 3.1: Setting the ISP device to SHIFT state.

Step 3.2: Sending an ERASE command to the ISP device.

Step 3.3: Setting ISP device to EXECUTE state.

Step 3.4: Holding ISP signals 89 for 200 milliseconds, thereby erasing any pre-existing programming in the ISP device.

Step 3.5: Setting the ISP device to SHIFT state.

Step 3.6: Sending an ADDRESS SHIFT command is the ISP device.

Step 3.7: Setting the ISP device to EXECUTE state.

Step 3.8: Sending an address to the ISP device.

Step 3.9: Setting the ISP device to SHIFT state.

Step 3.10: Sending a DATA SHIFT command to the ISP device.

Step 3.11: Setting the ISP device to EXECUTE state.

Step 3.12: Sending programming data 109 to the ISP device.

Step 3.13: Setting the ISP device to SHIFT state.

Step 3.14: Sending a PROGRAM command to the ISP device.

Step 3.15: Setting the ISP device to EXECUTE state.

Step 3.16: Holding ISP signals 89 for 40 milliseconds, thereby programming a new pattern (i.e., the pattern represented by programming data 109) into the ISP device.

Step 3.17: Setting the ISP device to SHIFT state.

Step 3.18: Sending a VERIFY command to the ISP device.

Step 3.19: Setting the ISP device to EXECUTE state.

Step 3.20: Holding ISP signals 89 for 30 milliseconds, thereby verifying the new pattern in the ISP device.

Step 3.21: Setting the ISP device to the SHIFT state.

Step 3.22: Sending a DATA SHIFT command to the ISP device.

Step 3.23: Setting the ISP device to EXECUTE state.

Step 3.24: Shifting programming data 109 out as the SDO signal, so that a checksum can be computed to verify whether the ISP device 102 is properly programmed.

In a second embodiment, illustrated by configurations 600, 700A, 700B, 800A and 800B of FIGS. 6, 7A, 7B, 8A and 8B, respectively, each ISP system 100 in ISP systems 120 can be programmed using a plurality of ISP System Programmers (Programmers) 151-1, 151-2, . . . , 151-n. In contrast to the first embodiment described above, where a single Parallel Programmer 107 is coupled to ISP systems 120, in second embodiments 600, 700, and 800, a Programmer (e.g. Programmer 151-1) is coupled to a single ISP system 100 in ISP systems 120.

As in the first embodiment described above, programming of ISP systems 120 is initiated when controller 105 receives programming data 109 from storage element 111. Controller 105 is connected to each of Programmers 151-1, 151-2, . . . , and 151-n over a communication link. Each communication link between controller 105 and Programmers 151-1, 151-2, . . . , and 151-n can be provided by a wired or wireless data network. In a wired data network, a hardwired connection through standard parallel port 204 or serial port 115 of controller 105 is utilized, generally illustrated in FIG. 6 as a wired communication link 601. Wireless communication links are illustrated in FIGS. 7A and 7B by infra-red communication links 701A and 701B, respectively, and in FIGS. 8A and 8B by radio wave communication links 801A and 801B, respectively.

Figure 7A:
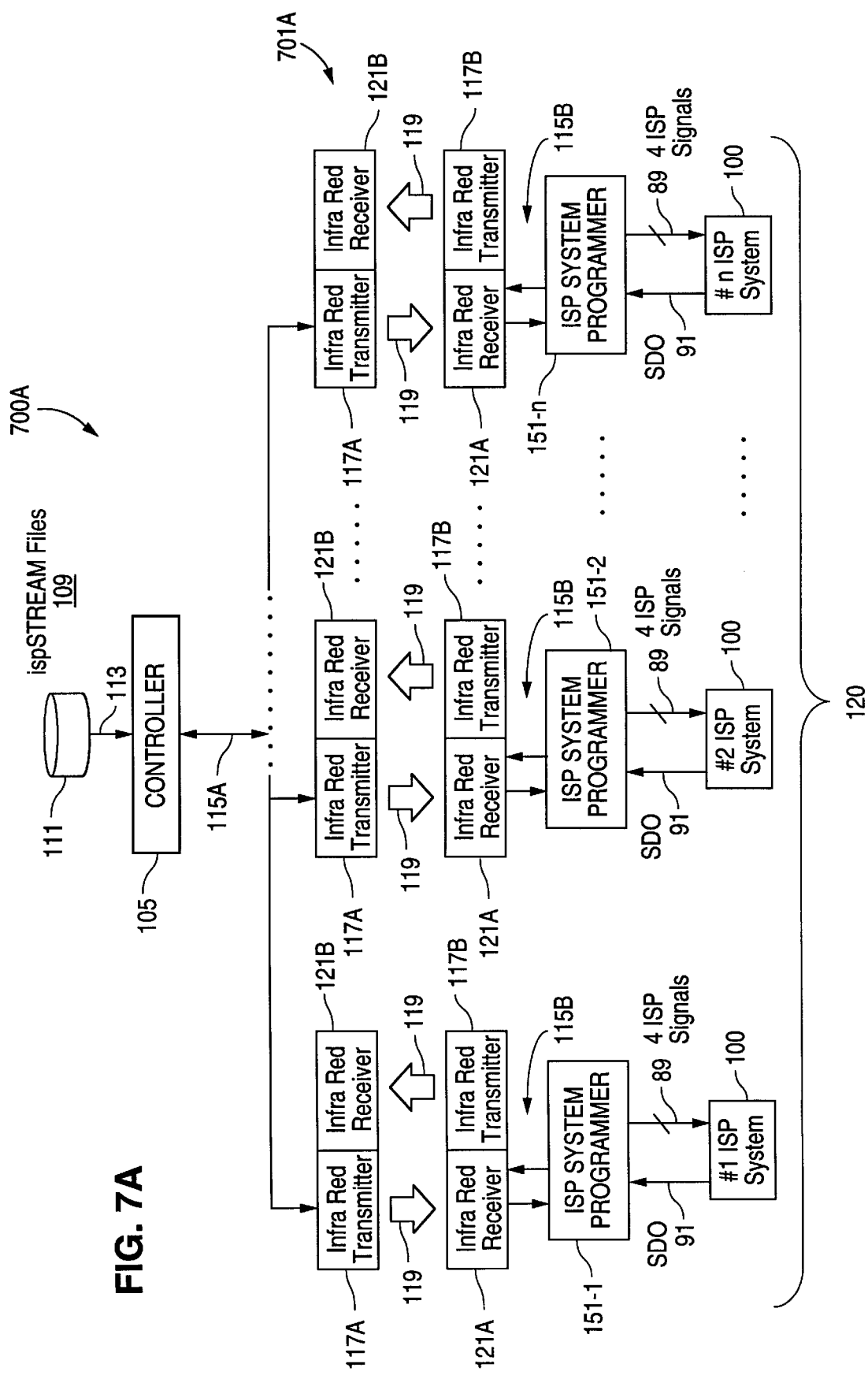
FIG. 7A illustrates a second configuration 700A of the second embodiment of the present invention, utilizing multiple ISP System Programmers 151, which are remotely accessed by controller 105 over a wireless infra-red data network 701A.

Referring to FIG. 7A, controller 105 sends commands and programming data 109 in 8-bit bytes to serial port interface 115A. Serial port interface 115A is connected to an array of infra-red transmitters 117A. Transmitters 117A convert and serialize the ISP commands or programming data 109 into light pulses 119. Light pulses 119 transmitted from each of transmitters 117A are detected and reconstituted by receivers 121A. Commands or programming data 109 are received by each of Programmers 151-1, 151-2, . . . , and 151-n via serial port 115B through a receiver 121A of associated Programmer 151-1, 151-2, . . . , and 151-n. Data from each of Programmers 151-1, 151-2, . . . , and 151-n are sent to controller 105 by infra-red transmitter 117B and receiver 121B over infra-red communication link 701A, in the reversed direction.

Figure 7B:
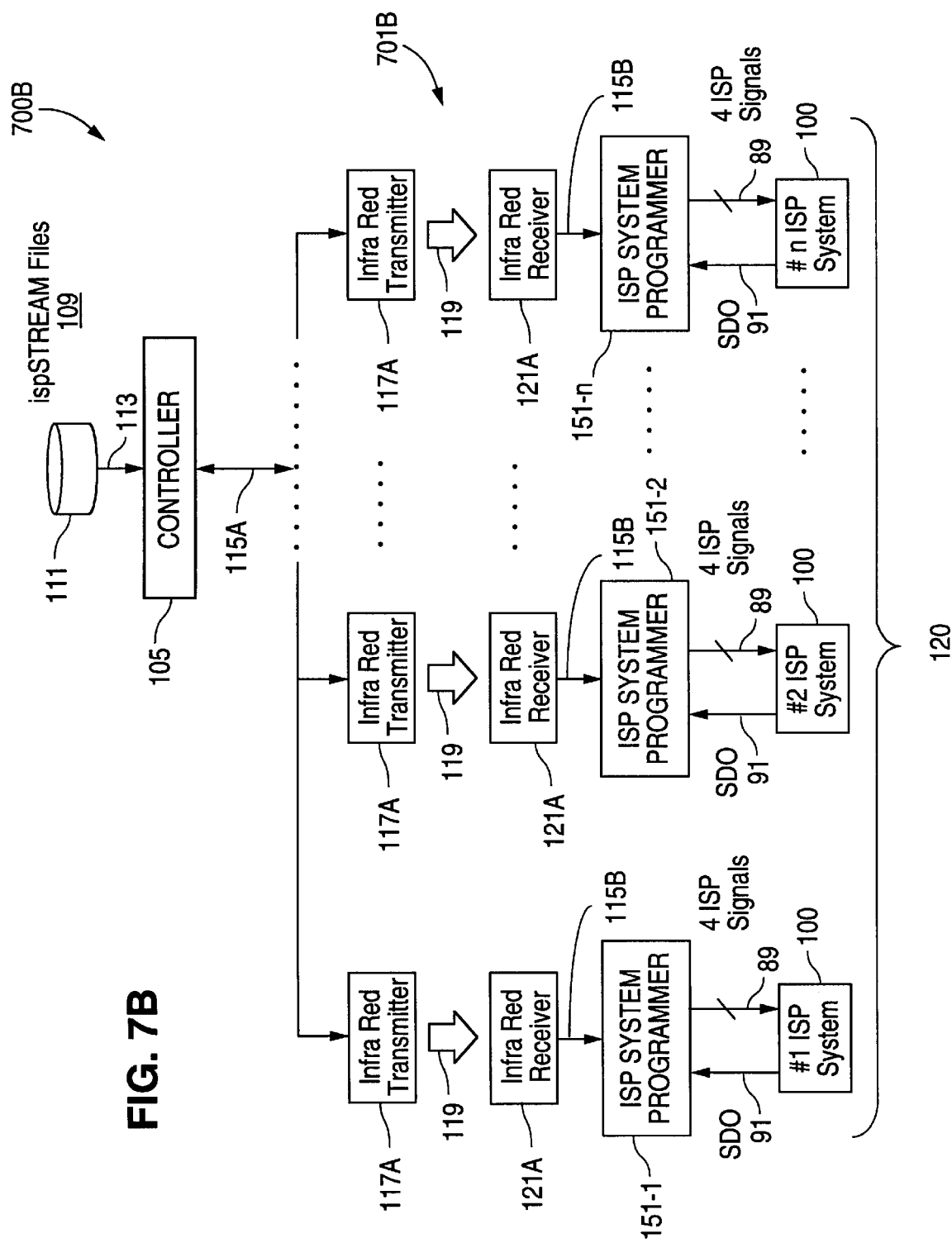
FIG. 7B illustrates a third configuration 700B of the second embodiment of the present invention, utilizing multiple ISP System Programmers 151, which are remotely accessed by controller 105 over a one-way wireless infra-red data network 701B.

Alternatively, as illustrated by configuration 700B of FIG. 7B, a one-way communication link can be provided between controller 105 and each of Programmers 151-1, 151-2, . . . , 151-n. In configuration 700B, Programmers 151-1, 151-2, . . . , 151-n can be equipped with a device, such as a light signal (not shown in FIG. 7B) to indicated whether the programming is successful.

Figure 8A:
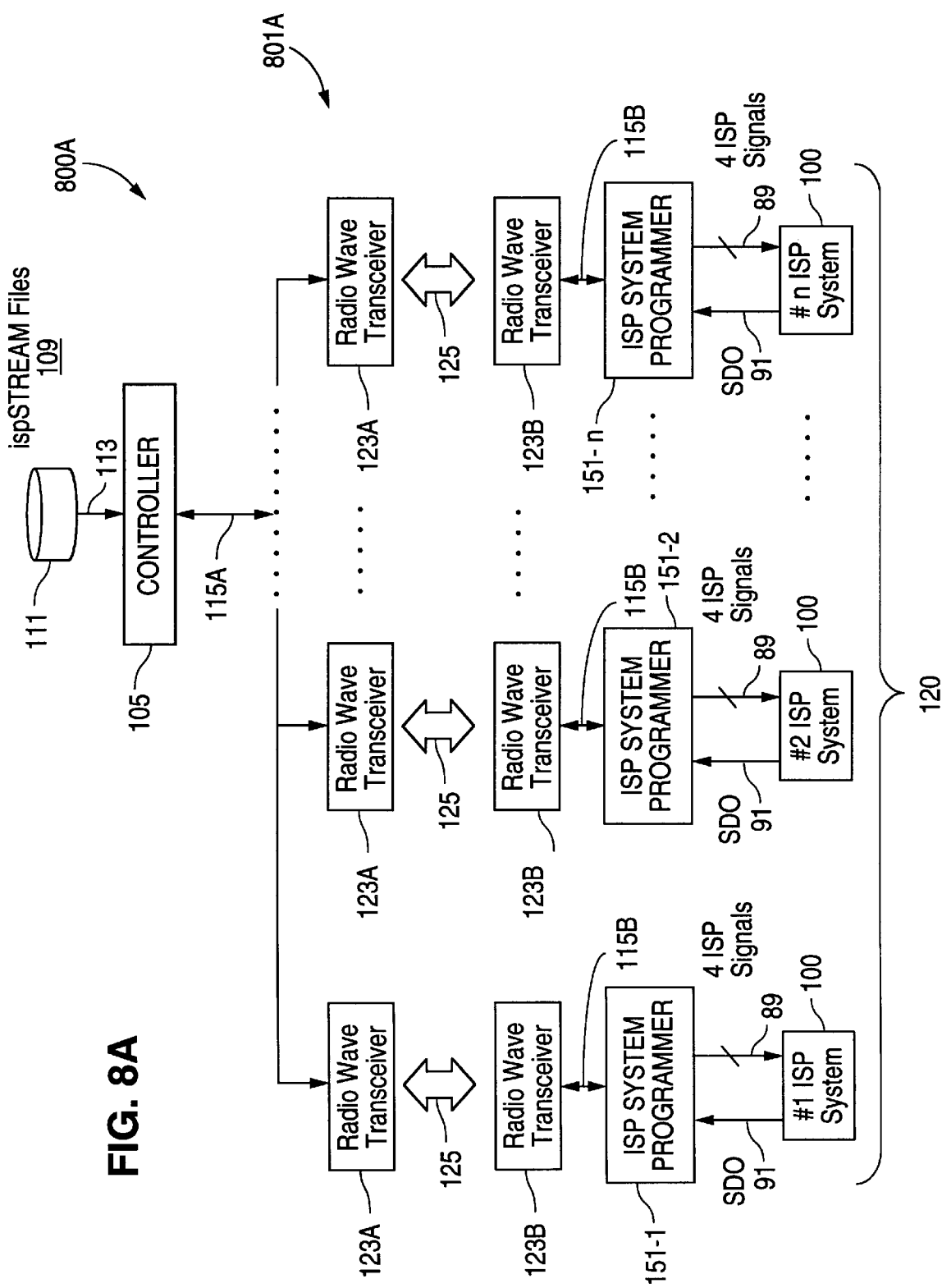
FIG. 8A illustrates a fourth configuration 800A of the second embodiment of the present invention, utilizing multiple ISP System Programmers 151, which are remotely accessed by controller 105 over a wireless radio wave data network 801A.
Figure 8B:
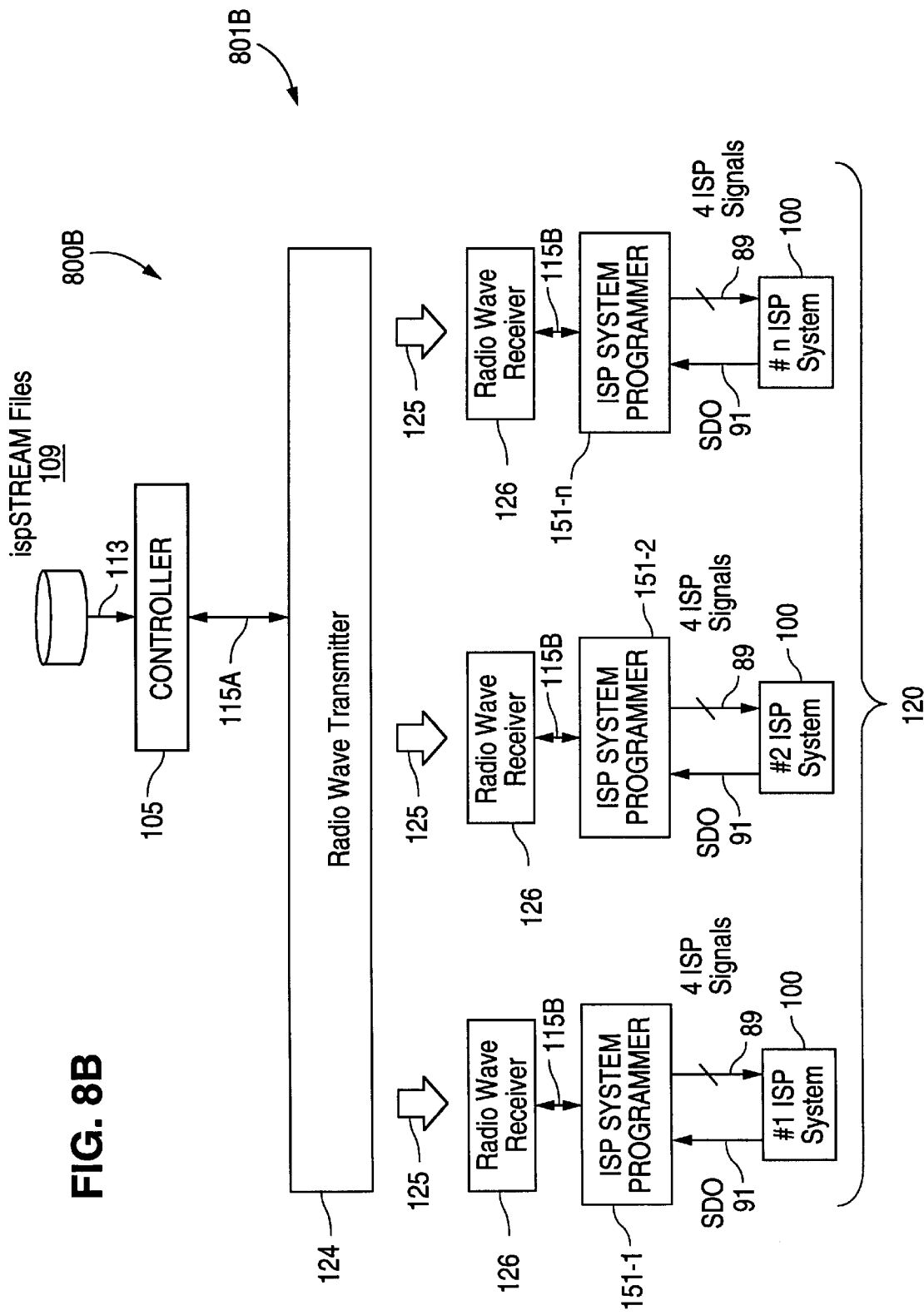
FIG. 8B illustrates a fifth configuration 800B of the second embodiment of the present invention, utilizing multiple ISP System Programmers 151, which are remotely accessed by controller 105 over a one-way wireless radio wave data network 801B.

Referring to FIG. 8A, wireless radio wave communication link 801A is configured in the same manner as communication link 701A of FIG. 7A, except that radio waves, rather than infra-red radiation, are used. Similarly, configuration 800B of FIG. 8B illustrates one-way radio wave communication link 801B between controller 105 and each of Programmers 151-1, 151-2, . . . , and 151-n, operating in substantially the same manner as configuration 700B.

Figure 9:
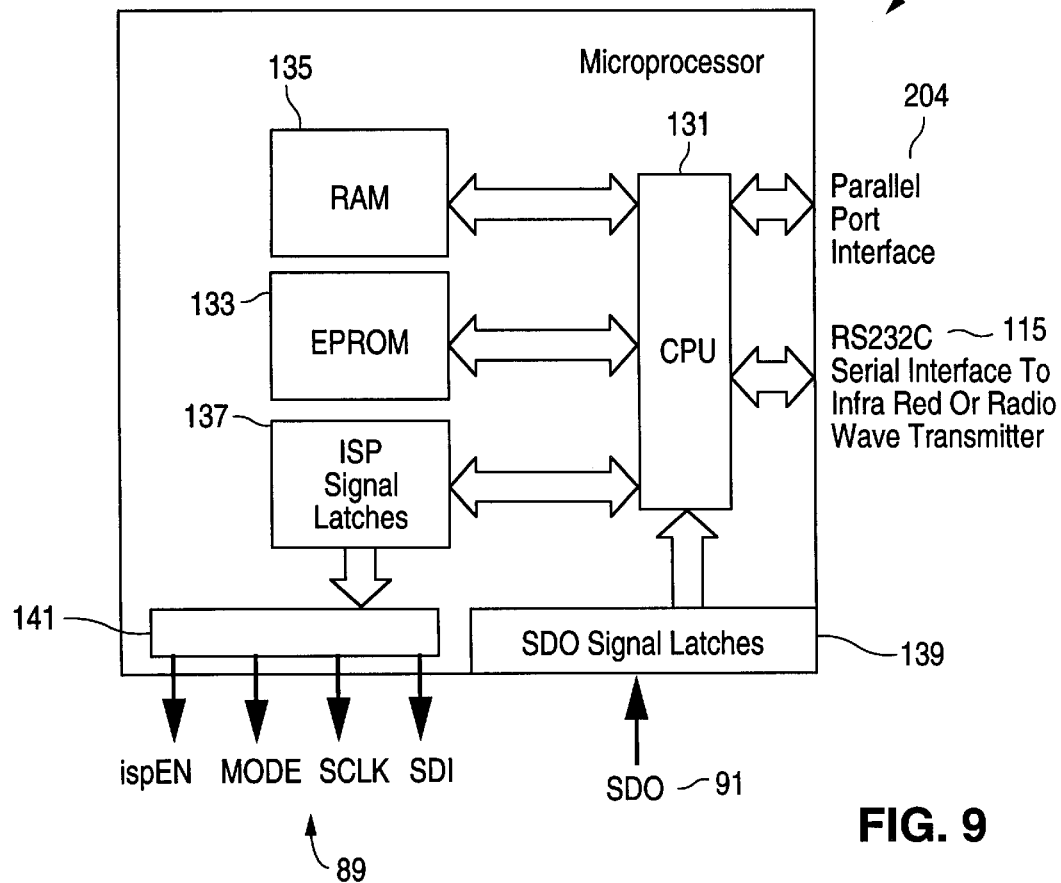
FIG. 9 illustrates components of ISP System Programmers 151, suitable for programming and reprogramming ISP systems 100 of FIGS. 1, 6, 7A, 7B, 8A and 8B.

FIG. 9 shows an implementation of a Programmer 151 (e.g., any one of Programmers 151-1, 151-2, . . . , and 151-n), which includes substantially the same components as Parallel Programmer 107 of FIG. 5, i.e., CPU 131, non-volatile storage element 133, RAM 135, clocked memory elements 137 and 139, and driver 141. Of course, since Programmer 151 is connected to a single ISP system, clocked element 139, which receives an output signal from an ISP device, can be 1-bit wide.

The operations of controller 105 for each of configurations 600, 700A, 700B, 800A and 800B are summarized as follows:

Step 5.1: Controller 105 establishes a communication link with each of Programmers 151-1, 151-2, . . . ,and 151-n.

Step 5.2a: Controller 105 sends commands to all of Programmers 151-1, 151-2, . . . , and 151-n. These commands include:
i) Connect: This command searches and connects the recipient Programmer (e.g., Programmer 151-1);
ii) Load programming data: This command transfers programming data 109 to the recipient Programmer;
iii) Program and Verify: This command starts programming operation in the recipient Programmer, including verifying programming echoed from ISP system 100 associated with the recipient Programmer;
iv) Verify: This command starts verification of ISP system 100 associated with the recipient Programmer; and
iv) Hardware Check: This command starts a self-check in ISP system 100 associated with the recipient Programmer.

Step 5.2b: Controller 105 monitors the response from each of Programmers 151-1, 151-2, . . . , and 151-n in configurations in which the communication link is two-way.

Step 5.3: CPU 131 of each of Programmers 151-1, 151-2, . . . , and 151-n acknowledges establishment of a communication link with controller 105, indicating readiness to receive command or data.

Step 5.4: Controller 105 retrieves programming data 109 from storage element 111 (e.g., disk storage).

Step 5.5: Controller 105 sends the Load programming data command and transmits programming data 109 to each of Programmers 151-1, 151-2, . . . , and 151-n simultaneously.

Step 5.6a: CPU 131 of each of Programmers 151-1, 151-2, . . . , and 151-n stores programming data 109 into its associated RAM 135.

Step 5.6b: CPU 131 of each Programmer 151-1, 151-2, . . . , and 151-n informs controller 105 readiness for the next command in configurations using a two-way data link between a Programmer and controller 105, e.g., configurations 700A and 800A of FIGS. 7 and 8, respectively.

Step 5.7: Controller 105 sends the Program and Verify command to start the programming and verification process.

Step 5.8: CPU 131 of each Programmer 151-1, 151-2, . . . , and 151-n programs and verifies its associated ISP system 100.

Step 5.9: Controller 105 sends the Verify command to each Programmer 151-1, 151-2, . . . , and 151-n. In configurations using two-way communication links, CPU 131 of each Programmer 151-1, 151-2, . . . , 151-n returns to controller 105 status information regarding the programming operation.

5.10: Controller 105 displays on a monitor any failure in the programming of each ISP system 100 associated with each Programmer 151-1, 151-2, . . . , and 151-n, where two-way communication links are used.

The operation of Programmer 151 (i.e., any of Programmers 151-1, 151-2, . . . , 151-n) is summarized as follows:

Step 6.1: Programmer 151 waits in a standby mode until a command arrives from controller 105.

Step 6.2: When Programmer 151 receives the Load programming data command from controller 105, Programmer 151 reads programming data 109, byte by byte, from parallel port 204 or serial port 115B and stores programming data 109 into the associated RAM 135.

Step 6.3: Having received programming data 109, Programmer 151 signals controller 105 that step 6.2 is completed, where two-way communication between controller 105 and Programmer 151 is used.

Step 6.4: Programmer 151 then calculates a checksum for programming data 109 and compares the checksum thus calculated with the checksum appended at the end of programming data 109 to verify that the transmission was successful and that no data corruption has occurred in the transmission process.

Step 6.5: Programmer 151 reports the result of transmission to the controller 105, where two-way communication between controller 105 and Programmer 151 is used.

Step 6.6: Programmer 151 waits for the next command from controller 105.

Step 6.7: Programmer 151 receives the Program and Verify command, and transfers programming data 109, byte from byte, from the associated RAM 136 into clocked memory element 137.

Step 6.8: Clocked memory element 137 drives ispEN signals 99 low, thereby setting the associated ISP system 100 into a programming mode.

Step 6.9: Clocked memory element 137 drives SDI signal 93 and SCLK 95 signal to shift ISP instructions and programming data 109 into ISP devices 102.

Step 6.10: Clocked memory element 137 drives MODE signal 97 and SCLK signal 95 to step ISP devices 102 in the associated ISP System 100 to complete the ISP programming cycles.

Step 6.11: Clocked memory element 137 drives SCLK signal 95 to shift data out from terminal 90 (SDO signal 91) for the associated ISP system 100.

Step 6.12: Clocked memory element 139 latches SDO signal 91.

Step 6.13: The data in clocked memory element 139 is verified. If the programmed data fails to verify, Programmer 151 halts the programming process and reports an error, where the communication link between Programmer 151 and controller 105 is two-way.

Step 6.14: Steps 6.8–6.13 are repeated until the associated ISP system 100 is programmed.

Step 6.15: Where the communication link between Programmer 151 and controller 105 is bi-directional, Programmer 151 reports to controller 105 any failure in programming its associated ISP system 100.

Step 6.16: Programmer 151 returns to Step 6.1.

The detailed description above is provided to illustrate specific embodiments of the present invention and is not intended to be limiting. Numerous variations and modifications within the scope of the invention are possible. The present invention is defined by the appended claims.

We claim:

1. A system for programming multiple programmable integrated circuits, comprising:

a) an in-system programmable (ISP) system having a plurality of ISP devices;

b) a programmer communicating with said ISP system, for programming said ISP devices;

c) a controller communicating with said programmer, said controller transmitting control data and programming data to said programmer; and d) a communication link connecting said controller to said programmer, said communication link comprising a wireless data network.

2. The system of claim 1, wherein said ISP devices receive data input signals from said programmer and said programmer receives a data output signal from said ISP devices.

3. The system of claim 1, additionally comprising more than one of said ISP system, wherein said programmer is connected to all of said ISP systems for programming said ISP systems in sequence.

4. The system of claim 1, additionally comprising more than one of said programmer and said ISP system wherein each of said programmers is connected to one of said ISP systems for programming said ISP systems simultaneously.

5. The system of claim 1, wherein said programmer comprises a central processing unit.

6. The system of claim 5, wherein said programmer additionally comprises a writeable control store coupled to said central processing unit.

7. The system of claim 6, wherein said programmer additionally comprises a random access memory coupled to said central processing unit for allowing said programming data to be stored therewith and retrieved therefrom.

8. The system of claim 5, wherein said programmer additionally comprises a random access memory coupled to said central processing unit for allowing said programming data to be stored therewith and retrieved therefrom.

9. The system of claim 5, wherein said programmer additionally comprises an input clocked memory element coupled to said central processing unit for holding data input signals.

10. The system of claim 6, wherein said programmer additionally comprises an input clocked memory element coupled to said central processing unit for holding data input signals.

11. The system of claim 7, wherein said programmer additionally comprises an input clocked memory element coupled to said central processing unit for holding data input signals.

12. The system of claim 8, wherein said programmer additionally comprises an input clocked memory element coupled to said central processing unit for holding data input signals.

13. The system of claim 5, wherein said programmer additionally comprises an output clocked memory element coupled to said central processing unit for holding a data output signal.

14. The system of claim 11, wherein said programmer additionally comprises an output clocked memory element coupled to said central processing unit for holding a data output signal.

15. The system of claim 1, wherein said programmer additionally comprises a driver for transporting data input signals.

16. The system of claim 14, wherein said programmer additionally comprises a driver for transporting said data input signals.

17. The system of claim 1, wherein said controller comprises a host central processing unit.

18. The system of claim 1, additionally comprising a storage element from which said controller retrieves said programming data.

19. The system of claim 1, wherein said communication link additionally comprises a wired data network communicating with said wireless data network.

20. The system of claim 1, wherein said wireless data network comprises a transmitter for converting electrical pulses to radio wave signals and a corresponding receiver for converting said radio wave signals back to said electrical pulses.

21. The system of claim 1, wherein said wireless data network comprises a transmitter for converting electrical pulses to infra-red signals and a corresponding receiver for converting said infra-red signal back to said electrical pulses.

22. A system for programming multiple programmable integrated circuits, comprising:
   a) an in-system programmable (ISP) system having a plurality of ISP devices;
   b) programming means communicating with said ISP system for programming said ISP devices;
   c) controller means communicating with said programming means for transmitting control data and programming data to said programming means; and
   d) interface means for connecting said controller means to said programming means through a communication means, wherein said communication means is a wireless data network.

23. The system of claim 22, wherein said ISP devices receive data input signals from said programming means and said programming means receives a data output signal from said ISP devices.

24. The system of claim 22, additionally comprising more than one of said ISP system wherein said programming means programs said ISP systems in sequence.

25. The system of claim 22, additionally comprising more than one of said ISP system wherein said programming means comprises a plurality of programmers, each connected to one of said ISP systems, said programming means programs said ISP systems simultaneously.

26. The system of claim 22, wherein said programming means comprises a central processing unit.

27. The system of claim 26, wherein said programming means additionally comprises a writeable control store coupled to said central processing unit.

28. The system of claim 27, wherein said programming means additionally comprises a random access memory coupled to said central processing unit for allowing said programming data to be stored therewith and retrieved therefrom.

29. The system of claim 26, wherein said programming means additionally comprises a random access memory coupled to said central processing unit for allowing said programming data to be stored therewith and retrieved therefrom.

30. The system of claim 26, wherein said programming means additionally comprises an input clocked memory element coupled to said central processing unit for holding data input signals.

31. The system of claim 27, wherein said programming means additionally comprises an input clocked memory element coupled to said central processing unit for holding data input signals.

32. The system of claim 28, wherein said programming means additionally comprises an input clocked memory element coupled to said central processing unit for holding data input signals.

33. The system of claim 29, wherein said programming means additionally comprises an input clocked memory element coupled to said central processing unit for holding data input signals.

34. The system of claim 26, wherein said programming means additionally comprises an output clocked memory element coupled to said central processing unit for holding a data output signal.

35. The system of claim 32, wherein said programming means additionally comprises an output clocked memory element coupled to said central processing unit for holding a data output signal.

36. The system of claim 22, wherein said programming means additionally comprises a driver for transporting data input signals.

37. The system of claim 35, wherein said programming means additionally comprises a driver for transporting said data input signals.

38. The system of claim 22, wherein said controller means comprises a host central processing unit.

39. The system of claim 22, additionally comprising a storage means from which said controller means retrieves said programming data.

40. The system of claim 22, wherein said communication means additionally comprises a a wired data network communicating with said wireless data network.

41. The system of claim 22, wherein said wireless data network comprises transmitting means for converting electrical pulses to radio wave signals and corresponding receiving means for converting said radio wave signals back to said electrical pulses.

42. The system of claim 22, wherein said wireless data network comprises transmitting means for converting electrical pulses to infra-red signals and corresponding receiving means for converting said infra-red signals back to said electrical pulses.

43. A method for programming multiple programmable integrated circuits, comprising the acts of:
   a) providing a controller;
   b) connecting said controller to a programmer through a communicating link, said communication link comprises a wireless data network;
   c) transmitting, through said communication link, programming data and control data from said controller to said programmer; and
   d) programming a plurality of in-system programmable (ISP) systems using said programmer.

44. The method of claim 43, wherein said communication link additionally comprises a wired data network communicating with said wireless data network.

45. The method of claim 43, wherein said wireless data network comprises a transmitter for covering electrical pulses to radio wave signals and a corresponding receiver for converting said radio wave signals back to said electrical pulses.

46. The method of claim 43, wherein said wireless data network comprises a transmitter for covering electrical pulses to infra-red signals and a corresponding receiver for converting said infra-red signals back to said electrical pulses.

47. The method of claim 43, wherein said programmer programs said ISP systems in sequence.

48. The method of claim 43, additionally comprising connecting said controller to a plurality of said programmers wherein each of said programmers is communicating with one of said ISP systems for programming said ISP systems simultaneously.

49. The method of claim 43, wherein said programmer comprises a central processing unit.

50. The method of claim 49, wherein said programmer additionally comprises a writeable control store coupled to said central processing unit.

51. The method of claim 50, wherein said programmer additionally comprises a random access memory coupled to said central processing unit for allowing said programming data to be stored therewith and retrieved therefrom.

52. The method of claim 49, wherein said programmer additionally comprises a random access memory coupled to said central processing unit for allowing said programming data to be stored therewith and retrieved therefrom.

53. The method of claim 49, wherein said programmer additionally comprises an input clocked memory element coupled to said central processing unit for holding data input signals.

54. The method of claim 50, wherein said programmer additionally comprises an input clocked memory element coupled to said central processing unit for holding data input signals.

55. The method of claim 51, wherein said programmer additionally comprises an input clocked memory element coupled to said central processing unit for holding data input signals.

56. The method of claim 52, wherein said programmer additionally comprises an input clocked memory element coupled to said central processing unit for holding data input signals.

57. The method of claim 49, wherein said programmer additionally comprises an output clocked memory element coupled to said central processing unit for holding a data output signal.

58. The method of claim 55, wherein said programmer additionally comprises an output clocked memory element coupled to said central processing unit for holding a data output signal.

59. The method of claim 43, wherein said programmer additionally comprises a driver for transporting data input signals.

60. The method of claim 58, wherein said programmer additionally comprises a driver for transporting said data input signals.

61. The method of claim 43, additionally comprising retrieving, prior to act (c), said programming data by said controller from a storage element.

62. The method of claim 43, additionally comprising indicating, subsequent to act (d), programming results of said ISP systems.

63. A method for programming multiple programmable integrated circuits, comprising the acts of:
   a) providing a controller;
   b) transmitting programming data and control data from said controller to a programmer; and
   c) programming a plurality of in-system programmable (ISP) systems using said programmer;
   wherein said programming act comprises providing data input signals to said ISP systems and receiving data output signals from said ISP systems, said ISP system containing a plurality of daisy-chained ISP devices.

64. A system for programming multiple programmable integrated circuits, comprising:
   (a) an in-system programmable (ISP) system having an ISP device;
   (b) a programmer communicating with said ISP system to program said ISP device, said programmer having a central processing unit, a writeable control store, a random access memory, an input clocked memory element, and an output clocked memory element; and
   (c) a controller transmitting data to said programmer through a communication link.

65. The system of claim 64, wherein said programmer additionally comprises a driver.

66. The system of claim 64, wherein said communication link comprises a wired data network.

67. The system of claim 64, wherein said communication link comprises a wireless data network.

68. The system of claim 67, wherein said wireless data network is operated by a transmission of radio wave signals.

69. The system of claim 67, wherein said wireless data network is operated by a transmission of infra-red signals.

* * * * *